United States Patent [19]

Guliani

[11] Patent Number: 5,109,187
[45] Date of Patent: Apr. 28, 1992

[54] CMOS VOLTAGE REFERENCE

[75] Inventor: Sandeep K. Guliani, Folsom, Calif.

[73] Assignee: Intel Corporation, Santa Clara, Calif.

[21] Appl. No.: 589,698

[22] Filed: Sep. 28, 1990

[51] Int. Cl.$^5$ .......................... G05F 3/24; G05F 3/26
[52] U.S. Cl. .................... 323/313; 323/315;
307/296.1; 307/296.6; 307/296.8; 365/189.09;
365/226
[58] Field of Search ............... 323/313, 314, 315, 316;
307/296.1, 296.6, 296.8; 365/189.09, 226

[56] References Cited

U.S. PATENT DOCUMENTS

| 4,052,229 | 10/1977 | Pashley . | |
|---|---|---|---|
| 4,096,584 | 6/1978 | Owen, III et al. . | |
| 4,103,189 | 7/1978 | Perlegos et al. . | |
| 4,203,158 | 5/1980 | Frohman-Bentchkowsky et al. | 365/185 |
| 4,742,292 | 5/1988 | Hoffman | 323/314 |
| 4,837,459 | 6/1989 | Bukowski et al. | 323/315 X |

OTHER PUBLICATIONS

P. R. Gray and R. G. Meyer, *Analysis and Design of Analog Integrated Circuits*, Chapter 12.3, pp. 730-737, (Wiley, Second Edition) (1984).

*Primary Examiner*—Steven L. Stephan
*Assistant Examiner*—Emanuel Todd Voeltz
*Attorney, Agent, or Firm*—Blakely, Sokoloff, Taylor & Zafman

[57] ABSTRACT

A circuit is described as a generating supply-independent voltage reference. In MOS technology, a current mirror section incorporating a pair of N-channel and W-channel tracking devices are coupled to a power supply $V_{cc}$ for generating a voltage reference output that is directly proportional to $V_{tn} - V_{tw}$. $V_{tn}$ is the gate threshold voltage of the N-channel device, while $V_{tw}$ is the gate threshold voltage of W-channel device. A start-up circuit is further coupled to the power supply $V_{cc}$ and to the current mirror section for maintaining the operating point $V_1$ of the circuit that is independent of supply voltage. The degree of supply independence can be further increased by adding a pair of P-channel device to the output of the present invention. Thus, the present invention generates a voltage reference that is independent from power supply, temperature and process while minimizing power dissipation. When the present invention replaces the power supply to the sensing circuit of non-volatile memory devices such as an EPROM the overshoot encountered during the read mode is minimized. It follows that the present invention not only solves one of the key yield losses seen on non-volatile memory devices but also improves the access time for the same devices.

10 Claims, 9 Drawing Sheets

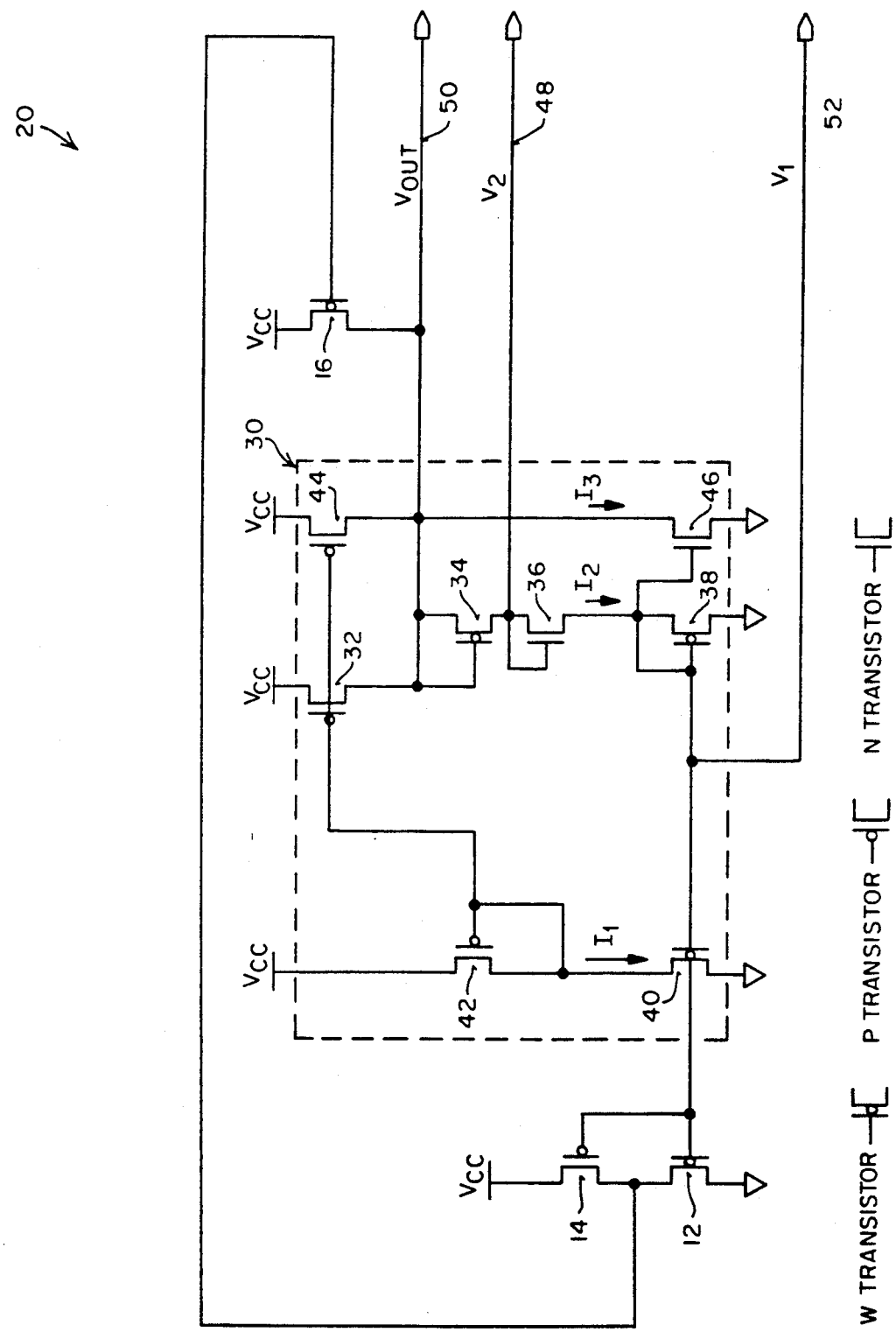
FIG_2

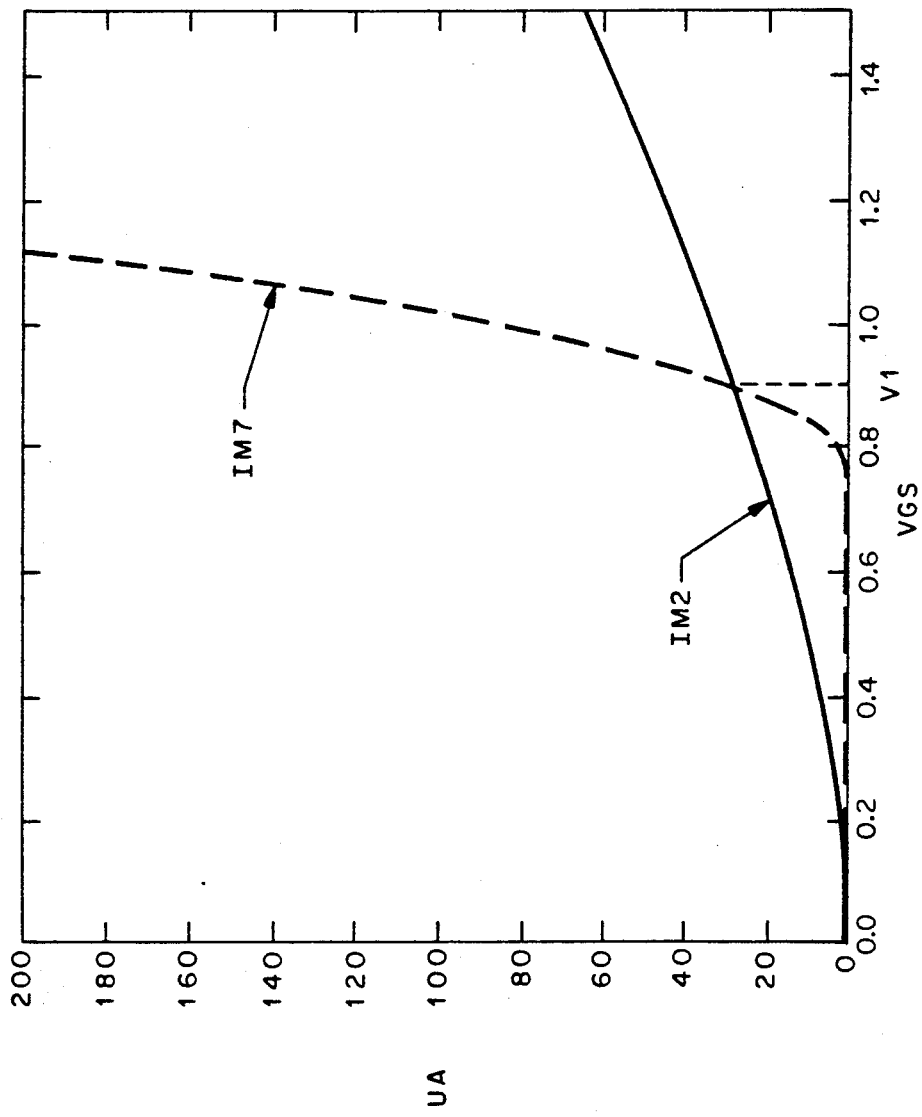

FIG_4
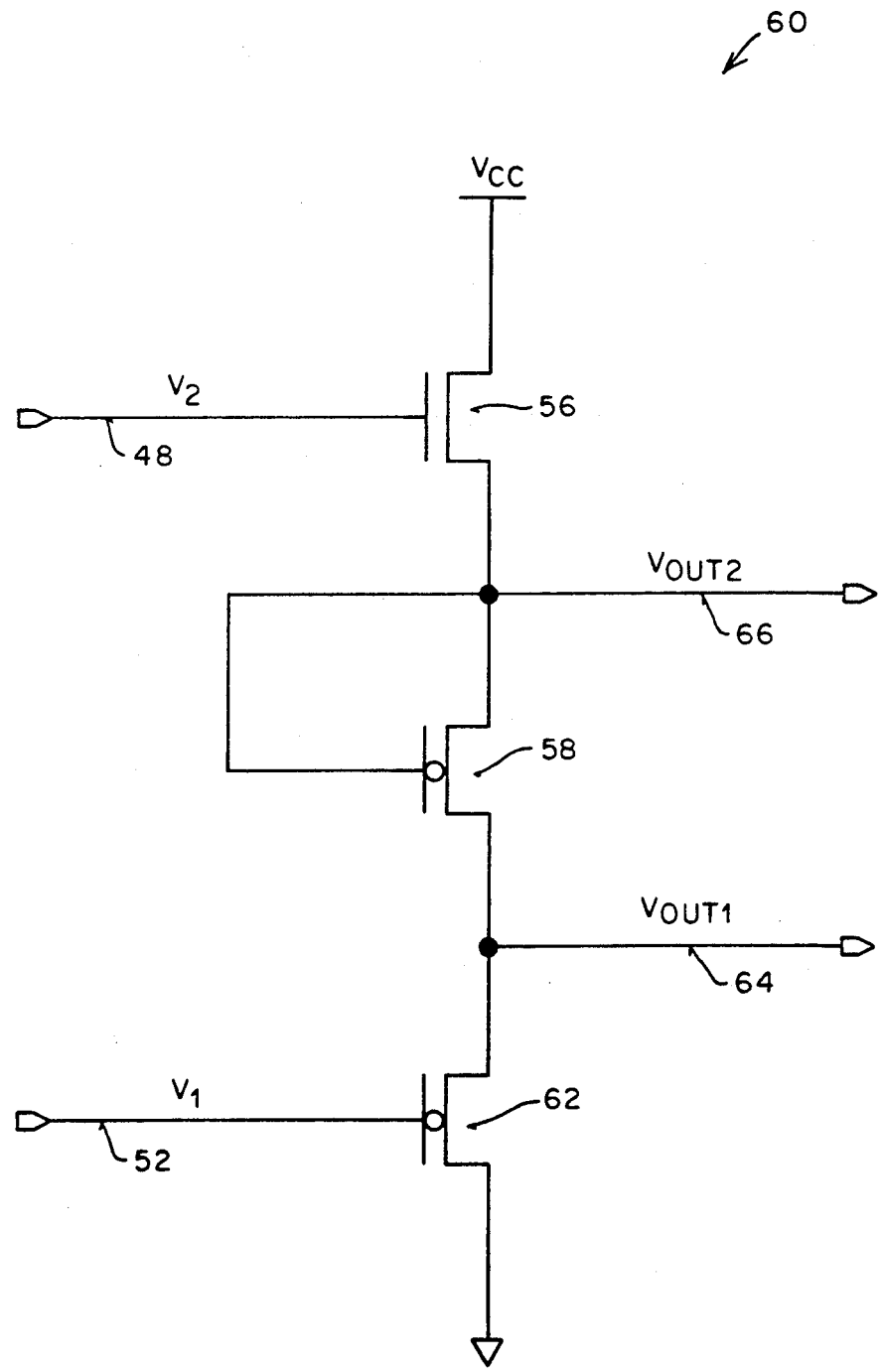

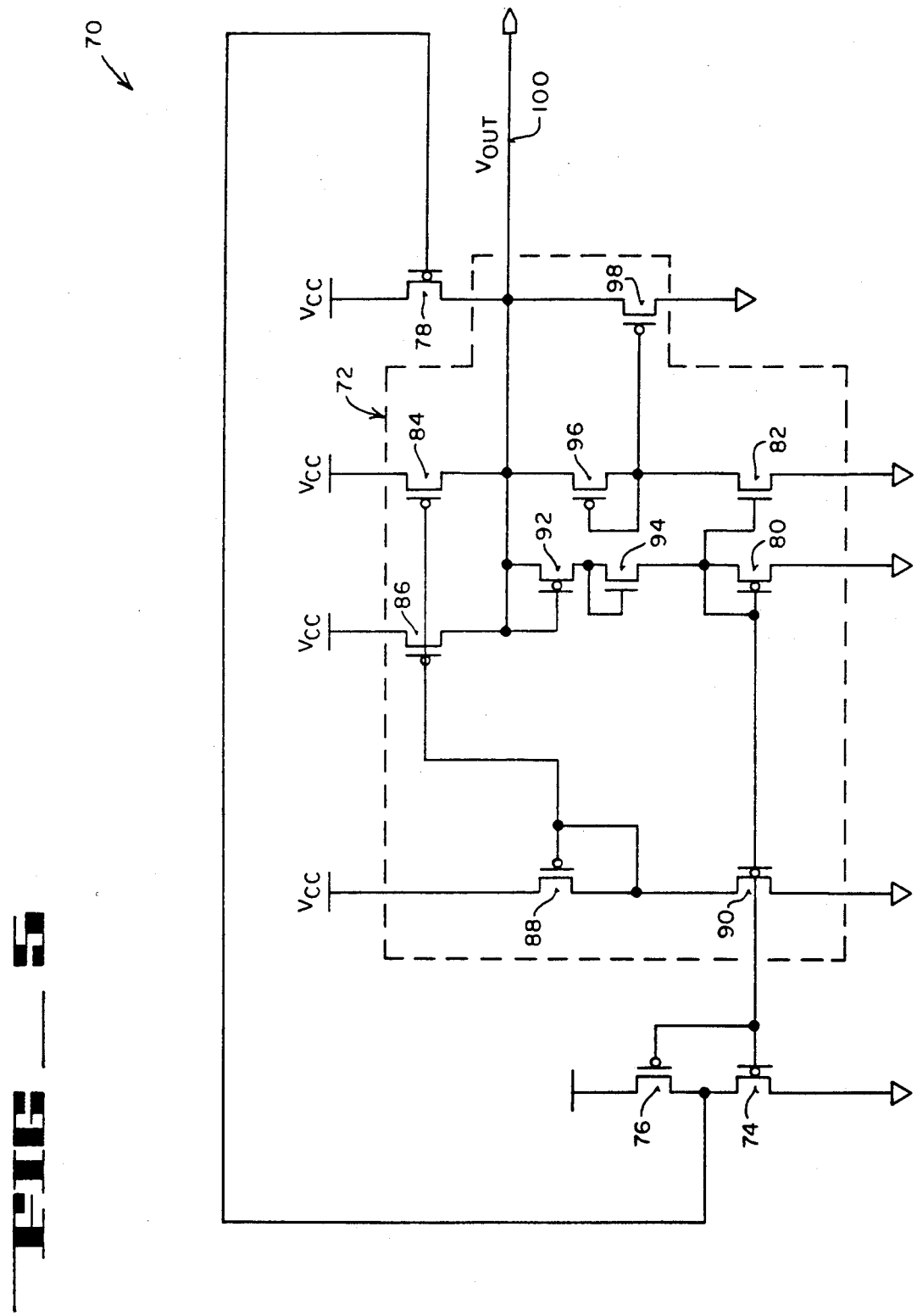
FIG_5

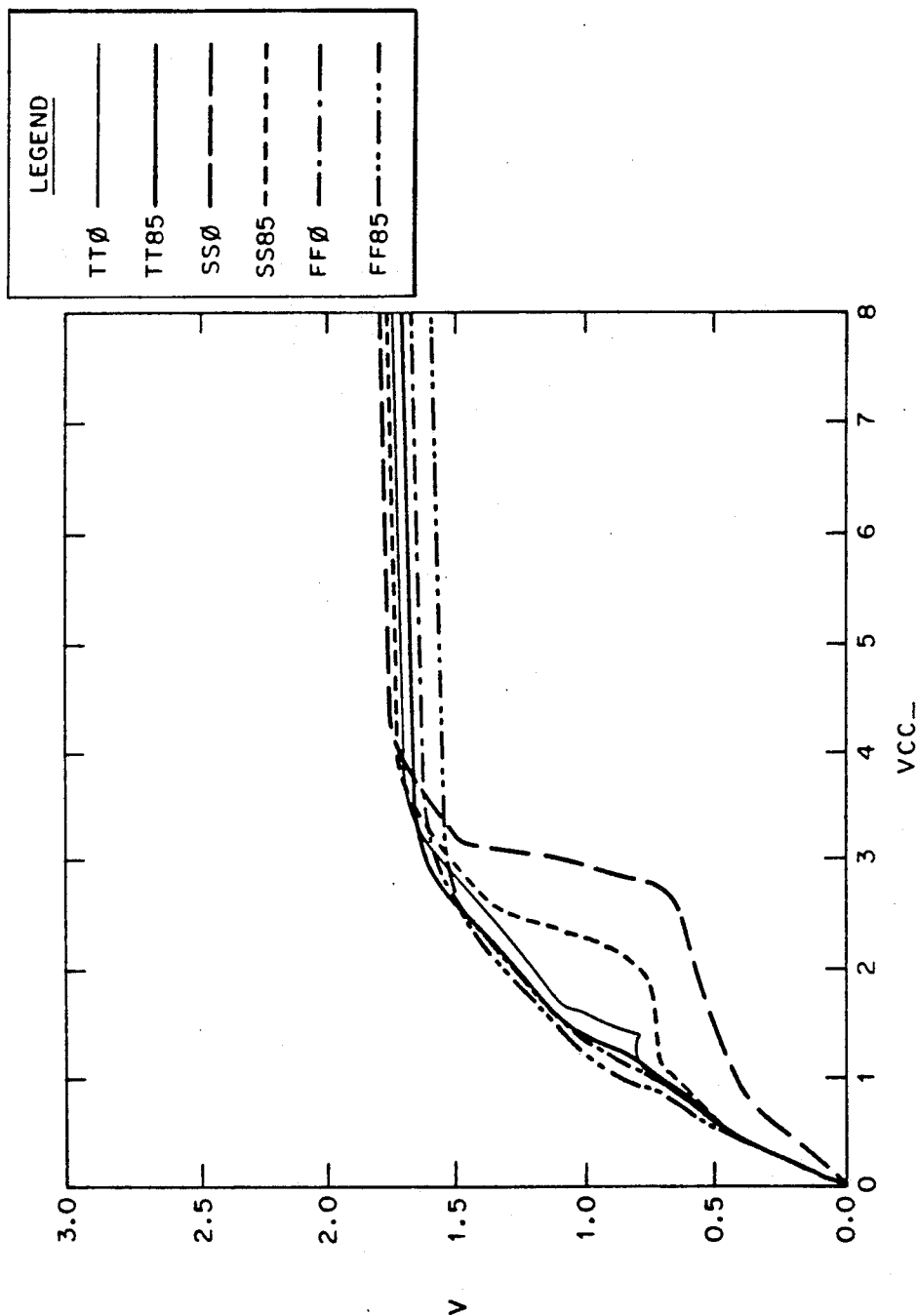

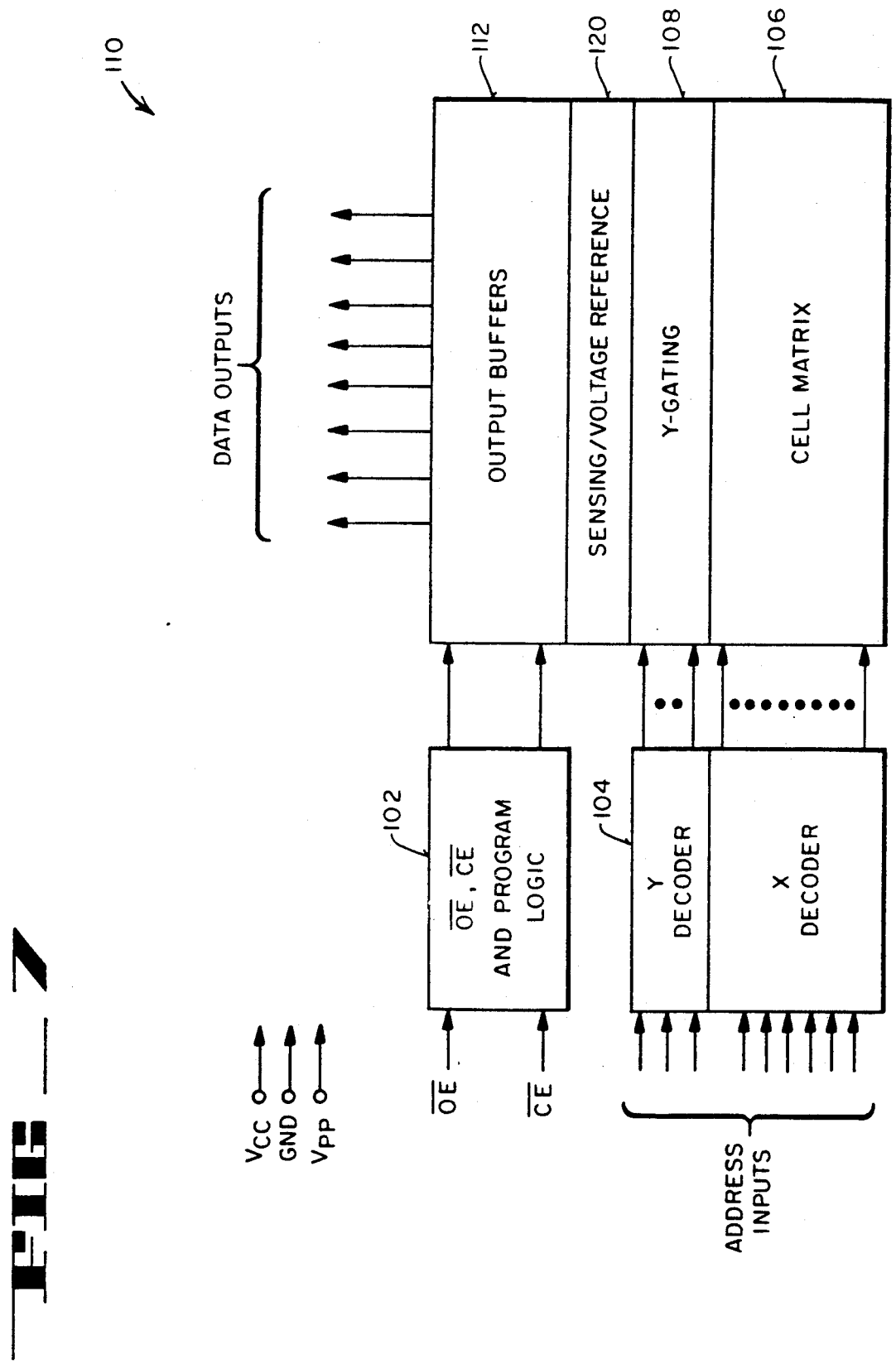
FIG_7

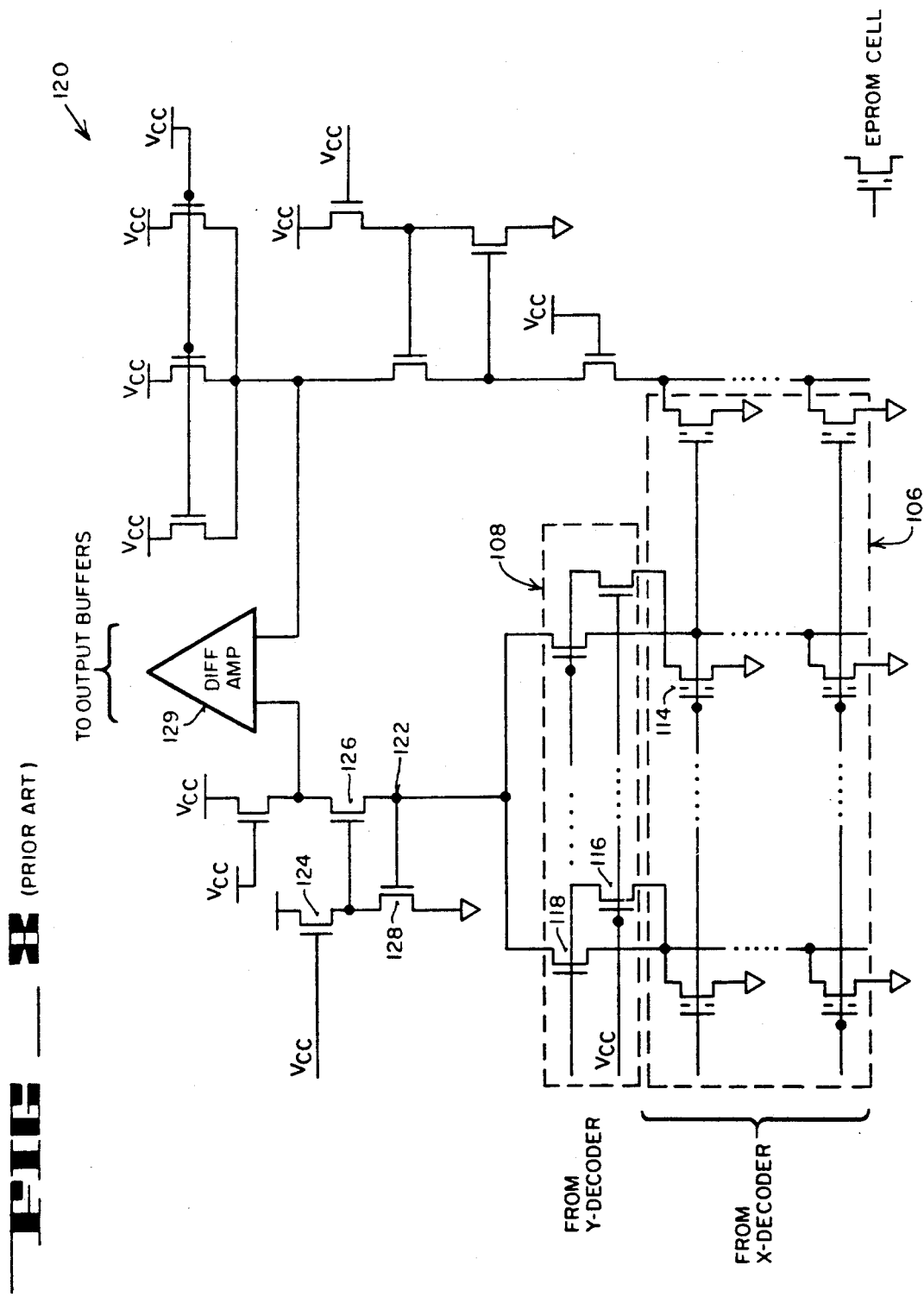

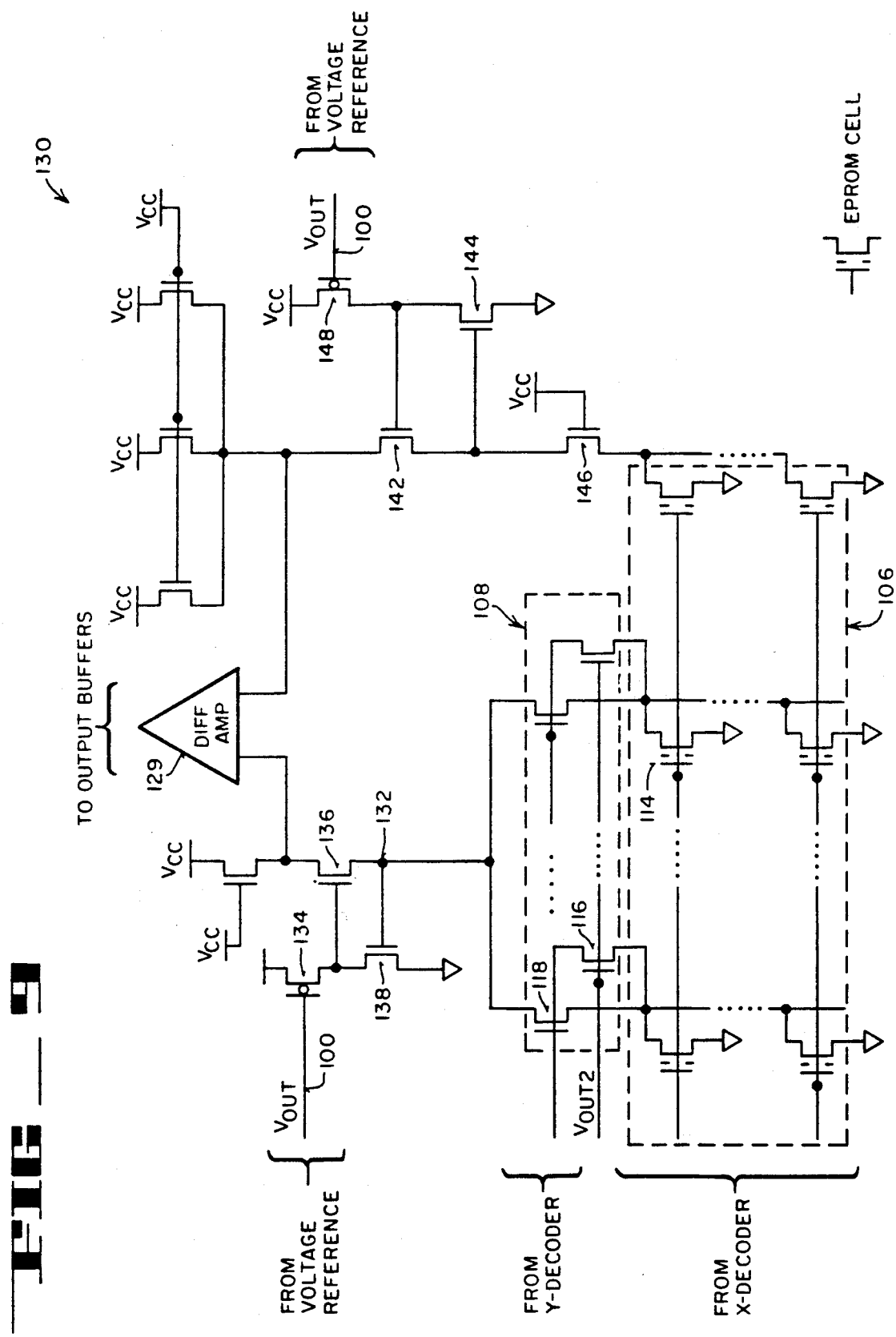

CMOS VOLTAGE REFERENCE

BACKGROUND OF THE INVENTION

1. Field of the Invention

This invention relates to a field of non-volatile memory devices and, in particular, to apparatus and means for providing a voltage reference that is independent of variations in supply voltage, temperature and process, and, more particularly, to a circuit for minimizing the overshoot problem encountered during memory access and for reducing the access time during the read mode of electrically programmable and electrically erasable read-only memories (EEPROMs) and of electrically programmable read-only memories (EPROMs) having floating gates implemented in metal-oxide-semi conductor (MOS) technology.

2. Art Background

The fabrication of non-volatile memory devices such as EPROMs utilizing MOS technology is well known in the prior art. These EPROMs employ memory cells utilizing floating gates which are generally formed from a polysilicon member completely surrounded by an insulator. Electrical charge is transferred into the floating gate using a variety of techniques such as avalanche injection, channel injection, Fowler-Nordheim tunneling, hot electron injection, etc. A variety of phenomena have been used to remove charge from the floating gates, including exposing the memory to ultraviolet radiation. The floating gate is programmed when the charge is stored in the floating gate. The cell is in unprogrammed, or erase state when the floating gate is discharged.

Because of the complex and time-consuming procedures required to erase EPROMs, these devices have been used primarily in applications requiring read-only memories. Electrically programmable and electrically erasable read-only memories (EEPROMs) were developed to erase and to rewrite the memory devices on a byte-by-byte basis. These EEPROMs have also been referred to as electrically alterable read-only memory. Commercially available EEPROMs have generally used a thin oxide region to transfer the charge into and from a floating gate. In a typical memory, a two-transistor cell is used. For instance, U.S. Pat. No. 4,203,158 discloses the fabrication of such EEPROMs into an array where X and Y select lines provided for the selection, programming, and reading of various EEPROM cells.

As circuitry on a single integrated circuit becomes more complex, establishing bias conditions that are independent of variations in power supply, temperature and process are critical in meeting the performance objective of the circuit. Wide fluctuations in bias current with supply voltages, temperature and process result in an unnecessary power consumption in such circuit. Furthermore, supply independent bias circuitry is required to minimize the injection of spurious high frequency signals from the power lines onto the signal lines. With respect to non-volatile memories, variations in the bias current result in poor frequency response of the sensing circuits and contribute to an undesirable condition called overshoot. Under overshoot, the sensing circuits coupled to the non-volatile memory would read the wrong value, i.e., where the sensing circuit is supposed to read a 1 which is an erased EPROM and on account of the slow feedback response, the sensing circuit actually reads 0 before it reads a 1. Thus, variation in the bias current to the non-volatile memory cells results in yield losses, poor access time and at worst, failed devices.

To achieve supply independence, one must refer the bias circuit to some potential other than the supply voltage. In MOS circuits, the choice of biasing circuit includes the use of a threshold voltage $V_t$, the use of the difference between the threshold voltages of dissimilar devices, $\Delta V_t$, the use of base-emitter voltage $V_{BE}$ of the parasitic bipolar transistor in CMOS technology, the use of thermo voltage $V_T$, the use of zener diode, and the use of band-gap voltage $V_{BG}$. See, Gray, P. R. and Mayer, R. G., "Analysis and Design of Analog Integrated Circuits", (Wiley: Second Edition, 1984), Chapter 12.3, pages 730–737.

SUMMARY OF THE INVENTION

It is an object of the present invention to generate a voltage reference that is independent of power supply.

It is a further object of the present invention to generate a reference voltage that is proportional to the difference in threshold voltages of two dissimilar, tracking transistors without incurring substantial chip real estate. The two transistors are N and W where N is an enhancement transistor and W is an unimplanted enhancement transistor.

It is further an object of the present invention to provide a constant drive to the drain bias circuitry of a non-volatile memory device to overcome the poor frequency response of the biasing circuit.

A circuit is described for generating supply-independent voltage reference in MOS technology. A current mirror section incorporating a pair of N-channel and W-channel devices is coupled to a power supply $V_{cc}$ for generating a voltage reference output that is directly proportional to $V_{tn} - V_{tw}$. $V_{tn}$ is the gate threshold voltage of the N-channel device, while $V_{tw}$ is the gate threshold voltage of W-channel device. A start-up circuit is further coupled to the power supply $V_{cc}$ and to the current mirror section for maintaining the operating point $V_1$ of the circuit that is independent of supply voltage. The degree of supply independence can be further increased by adding a pair of P-channel device to the output of the present invention. Thus, the present invention generates a voltage reference that is independent of power supply, temperature and process while minimizing power dissipation. When the present invention replaces the power supply to the sensing circuit of non-volatile memory devices such as an EPROM the overshoot encountered during the read mode is minimized. It follows that the present invention not only solves one of the key yield losses seen on non-volatile memory devices but also improves the access time for the same devices.

BRIEF DESCRIPTION OF THE DRAWINGS

FIG. 2 is an electric schematic of a circuit for generating voltage that is independent of supply and when used in conjunction with a sensing circuit in FIG. 9 causes the drive on the feedback devices of the drain bias circuit to be independent of supply, temperature and process.

FIG. 3 illustrates the operating characteristics of the N-channel and W-channel devices as well as the operating point of the circuit used in the preferred embodiment of the present invention.

FIG. 4 illustrates a subcircuit for generating a voltage reference that is independent of supply, temperature and process in the preferred embodiment of the present invention.

FIG. 5 is an improved circuit of FIG. 2 for better supply independence.

FIG. 6 is a diagram illustrating the voltage reference output of the present invention as a function voltage for typical, slow and fast skew rates over a wide range of temperature and process corners.

FIG. 7 is a block diagram illustrating the present invention being coupled to a non-volatile memory device.

FIG. 8 is an electric schematic of a prior art sensing circuit having as one of its input an external power supply $V_{cc}$.

FIG. 9 is a sensing circuit for a non-volatile memory device having the voltage reference output from the present invention as its input and further being coupled to a pair of W-channel devices.

DETAILED DESCRIPTION OF THE INVENTION

Figure 1:
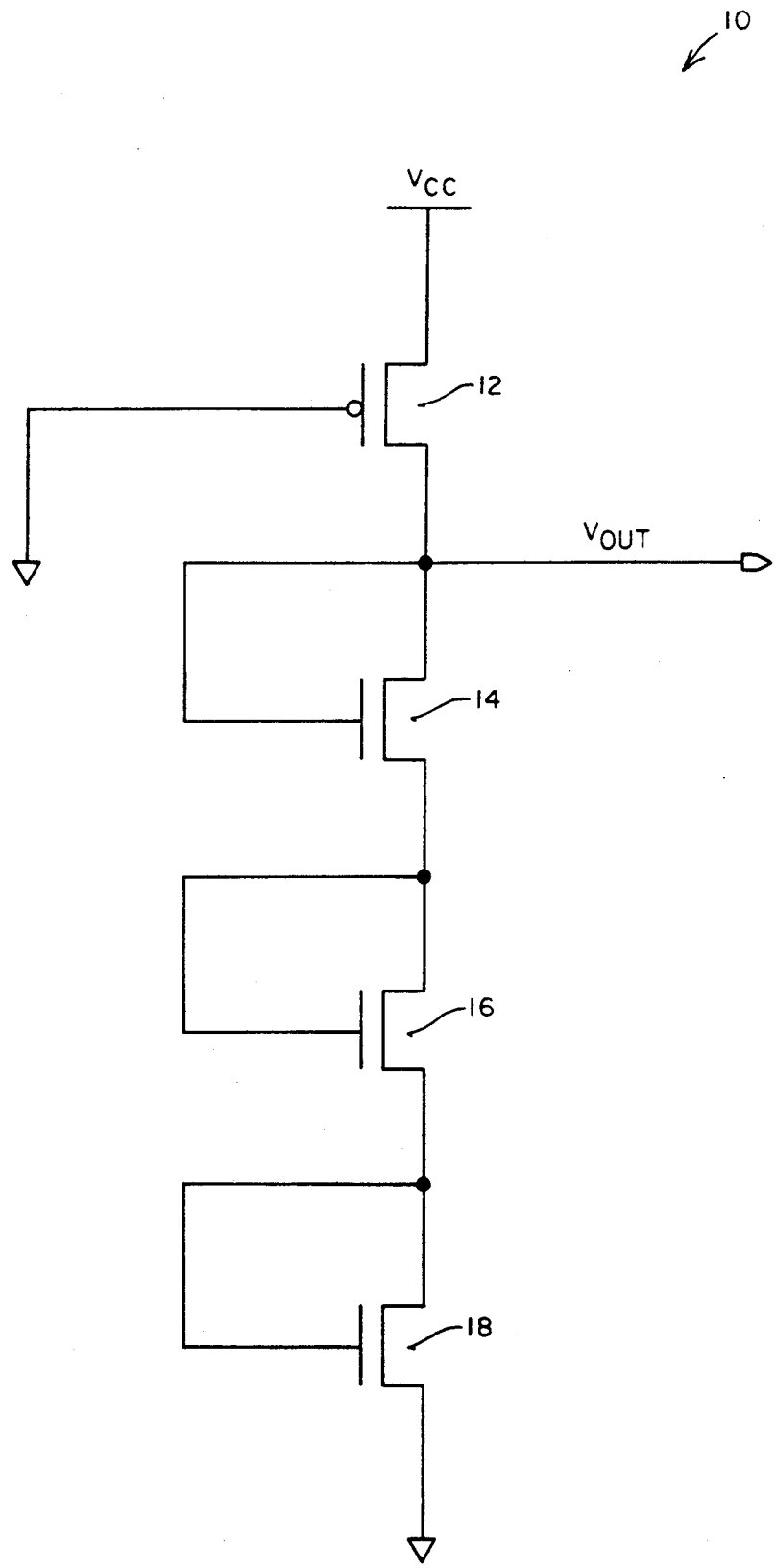
FIG. 1 is an electric schematic of a prior art voltage reference for non-volatile memory device.

A circuit is described for generating a voltage reference that is independent of supply, temperature and process in MOS technology. In the following description, numerous specific details are set forth such as specific conductivity types in order to provide a thorough understanding of the present invention. In other instances, well known elements such as resistors, N-channel devices, P-channel devices, W-channel devices and other well known fabrication techniques are not described in detail in order not to unnecessarily obscure the present invention. It should be understood by one skilled in the art that a non-volatile memory device referred to read/write memory in integrated circuit form which retains data whether or not power is applied.

In the preferred embodiment of the present invention, the circuit of the present invention is fabricated along with the entire memory cell on a P-type silicone substrate ordinarily metal-oxide-semiconductor (MOS) processing is employed and more specifically complimentary metal-oxide-semiconductor (CMOS) technology is used to fabricate the present invention, where N-devices are formed in the substrate and P-type devices are formed in the N-wells, the N-wells being first formed in the substrate. W-channel devices are also used in the present invention. A W-channel device is an enhancement type device with a gate threshold voltage of approximately 0.0 volts.

FIG. 1 is an electric schematic of a prior art circuit for generating voltage reference outputs. A voltage reference circuit 10 includes a P-channel device 12 and a plurality of N-channel devices, 14–18. The source of the P-channel device is coupled to the voltage supply $V_{cc}$ while the gate of the P-channel device 12 is grounded. The drain of the P-channel device is coupled to the drain of the N-channel device 14. Each of the gates of the N-channel devices is tied to its respective drain. The voltage output of the voltage reference circuit 10 varies with the variations in power supply, temperature and process. The circuit 10 also dissipates more power.

FIG. 2 is an electric schematic of a circuit for generating voltage that is independent of supply and when used in conjunction with a sensing circuit in FIG. 9 causes the drive on the feedback devices of a non-volatile memory device to be independent of supply, temperature and process. The circuit 20 comprises a current mirror section 30 and a start-up circuit including transistors 12, 14 and 16. The details and the function of the start-up circuit is elaborated further below. The current mirror section 30 comprises P-channel devices 32, 44 and 42; N-channel devices 36 and 46; and W-channel devices 34, 38 and 40. The source of the P-channel devices 32, 42 and 44 are coupled to the external voltage supply $V_{cc}$ for receiving power therefrom. On the other hand, the source of W-channel devices 38 and 40 and the N-channel device 46 are grounded. The gates of the P-channel devices 32, 42 and 44 are commonly tied. Therefore, the drain current of the P-channel device 42 is mirrored into the P-channel devices 32 and 44, respectively. Furthermore, the gate of the P-channel device 42 is tied to its drain which in turn is further coupled to the drain of the W-channel device 40. It follows that a current $I_1$ flows from the P-channel device 42 towards the W-channel device 40. Referring again to FIG. 2, the P-channel device 32 is coupled with the W-channel device 34, the N-channel device 36 and the W-channel device 38. Furthermore, a current $I_2$ flows from the P-channel device 32 towards the W-channel device 38. The gates of the devices 34, 36 and 38 are tied to their respective drains. Moreover, the drain of the P-channel device 44 is coupled to the drain of the N-channel device 46 in generating a current $I_3$. Finally, the gates of the W-channel device 40 is tied commonly to the gates of W-device 38 and the N-channel device 46. Just as the drain current of the P-channel device is mirrored into the P-channel devices 32 and 44, the drain current of W-channel device 38 is also mirrored into the N-channel device 46. Assuming high output impedance for the devices comprising the current mirror section 30, this implies that:

$$I_1 = I_2 = I_3$$

If one were to measure the current versus the gate source voltage $V_{gs}$ of the node 52 between the W-channel device 38 and the N-device 36, one observes an operating characteristic as illustrated in FIG. 3. The plot of the curve representing 0 values on the diagram in FIG. 3 is the operating characteristics of the W-channel device 38, while the curve of values representing 1s in the diagram of FIG. 3 corresponds to the operating characteristics of the N-channel device 46 in FIG. 2. Referring again to FIG. 3, the intersection of the operating characteristics of the W-channel device 38 and that of the N-channel device 46 corresponds to an operating point $V_1$ that is independent of supply voltages.

Referring again to FIG. 2, if the current gain of the N-channel device 46, $\beta_{46}$ is much greater than that of the W-channel 38, $\beta_{38}$ then approximately:

$$V_1 = V_{tn} \quad (1)$$

$$V_2 = 2V_{tn} + a(V_{tn} - V_{tw}) \quad (2)$$

$$V_{out} = 2V_{tn} + V_{tw} + b(V_{tn} - V_{tw}) \quad (3)$$

where $\beta_{Mn} = \mu C_{ox}(Z/L)_{Mn}$, the Ebers-Moll Equation $a = (\beta_{38}/\beta_{36})^{\frac{1}{2}}$ $b = (\beta_{38}/\beta_{36})^{\frac{1}{2}} + (\beta_{38}/\beta_{34})^{\frac{1}{2}}$ $V_{tn}$ = Threshold of N-channel device 46
$V_{tw}$ = Threshold of W-channel device 38

From Equation 3 above, the level of voltage reference output generated by the circuit in FIG. 2 can be adjusted by changing the size of the devices 34, 36 and 38. Referring again to FIG. 4, the nodes 48 and 52 of the circuit 20 in FIG. 4 are coupled to the gates of an N-channel device 56 and a W-channel device 62. Devices 56 and 62 are coupled to another W-channel device 58. It follows:

$$\beta_{56}(V_2 - V_{out2} - V_{tn})^2 = \beta_{58}(V_{out2} - V_{out1} - V_{tw})^2 \quad (4)$$
$$= \beta_{62}(V_1 - V_{tw})^2$$

Using equations (1), (2), (3) and (4)

$$V_{out2} = V_{tN} + c(V_{tn} - V_{tw}) \quad (5)$$

$$V_{out1} = d(V_{tn} - V_{tw}) \quad (6)$$

where $$c = (\beta_{38}/\beta_{36})^{\frac{1}{2}} - (\beta_{62}/\beta_{56})^{\frac{1}{2}}$$

and $$d = 1 - (\beta_{38}/\beta_{36})^{\frac{1}{2}} - (\beta_{62}/\beta_{56})^{\frac{1}{2}} - (\beta_{62}/\beta_{58})^{\frac{1}{2}}$$

The circuit in FIG. 4 when coupled to the circuit in FIG. 2 generates an output voltage $V_{out1}$ that is proportional to $V_{tn} - V_{tw}$ and therefore is independent of supply, temperature and process.

Referring again to FIG. 2, the start-up circuit comprising a W-channel device 12, a P-channel device 14 and a W-channel device 16 is coupled to the current mirror section 30 for maintaining the operating point of the circuit 20 in accordance with the diagram in FIG. 3. Just as in the current mirror section 30, the start-up circuit is coupled to the external voltage supply $V_{cc}$ over the source of the P-channel device 14, and over the drain of the W-channel device 16. The source of the W-channel device 16 is coupled to the voltage output of the current source section 30. The gate of the W-channel device 16 is coupled to the drains of the P-channel device 14 and the W-channel device 12 respectively. The gates of the P-channel device 14 and that of the W-channel device 12 are commonly tied to the gate of the W-channel device 40 in the current mirror section 30. The voltage reference circuits such as 20 in FIG. 2 often have a stable state in which 0 current flows in the circuit even when the power supply voltage is non-zero. The start-up circuit is required to prevent the circuit from remaining in this state. As such, the start-up circuit maintains the operating point of the circuit 20 as closes as possible to operating point $V_1$ as illustrated in FIG. 3.

FIG. 5 is an improvement of circuit 20 in FIG. 2 for power supply independence. The voltage reference circuit is identical to the voltage reference circuit 20 in FIG. 2 with the exception of a pair of P-channel devices 96 and 98. Assuming again that the current gain of the N-channel device 82, $\beta_{82}$, is much greater than that of the W-channel device 80 then to the first order of approximation:

$$\Delta V_{out}/\Delta V_{cc} \propto 1/g_{82} \quad (7)$$

$G_{82}$ corresponds to the transconductance of the N-channel device 82 in FIG. 5. The degree of supply independence of the circuit 70 can be increased from equation (3) above by a factor of $(\beta_{98}/\beta_{96})^{\frac{1}{2}}$. This can be accomplished by adding a pair of P-channel device 96 and 98 to the circuit 20 as illustrated in FIG. 5.

FIG. 6 is a diagram illustrating the change in the voltage output reference $V_{out1}$ from FIG. 4 as a function of the external voltage supply $V_{cc}$ over a range of temperature and process corners. The curves representing data points from 0 to 5 show the variations of the voltage reference with that of the supply voltages over typical, slow, and fast skews over a temperature range from 0 degree centigrade to 85 degree centigrade. If follows from the diagram in FIG. 6 that the present invention generates a voltage reference which is quite independent of power supply, temperature and process. The diagram in FIG. 6 also confirms that the W-channel device 38 and the N-channel device 46 track closely with the variations in temperature and process.

FIG. 7 is a block diagram of a non-volatile memory device where the present invention is used in conjunction with the sensing circuit coupled thereto. The non-volatile memory device 110 comprises program logic unit 102, address decoder 104, cell matrix 106, Y-gating 108, sensing circuit 120 and output buffers 112. In the preferred embodiment of the present invention, the non-volatile memory device 110 comprises 27C040 EPROM manufactured by Intel Corporation, Santa Clara, Calif. It should be understood by one skilled in the art that the present invention is applicable to any non-volatile memory devices which require constant voltage reference. A sensing circuit 120 is coupled to the Y-gating 108 and to the cell matrix 106 for reading data therefrom in response to receiving inputs from the address decoder 104.

FIG. 8 is an electric schematic of the sensing circuit, the Y-gating and the cell matrix of a non-volatile memory device as shown in FIG. 6. The cell matrix 106 comprises a plurality of EPROM cells, the representative of which is cell 114. The Y-gating 108 comprises one row of N-channel devices—designated as the column select line—the representative of which is device 118. The Y-gating 108 further comprise another of N-channel devices—designated as the leaker devices, the representative of which is device 116. The sensing circuit 120 comprises a plurality of N-channel devices coupled to a differential amplifier 129. The differential amplifier 129 is coupled at one of its input to the Y gating 108 while the other input is coupled to the cell matrix 106. The differential amplifier 129 is coupled at its output to the output buffers 112 in FIG. 8. As the circuit elements are identical to each of the inputs for the differential amplifier 129, only one such input will be discussed in detail. Under the prior art sensing circuit 120, the Y-gating 108 is coupled to an external voltage supply $V_{cc}$ over a pair of N-channel devices 124 and 128. Because the N-channel devices 124 and 128 do not track temperature and process, the feedback response formed by these two devices become so slow under some skew conditions that it causes a big overshoot at the node 122 thus resulting in an output glitch. The glitch often causes the sensing device to read intermediate values rather than the 0 or 1 from the EPROM cells in the cell matrix 106.

FIG. 9 is an electric schematic of a new sensing circuit having at its input the voltage reference of the present invention. The sensing circuit 130 is substantially similar to the sensing circuit 120 in FIG. 8 except that the N-channel device 124 of the sensing circuit 120 has been replaced with a W-channel device 134 in sensing circuit 130. Furthermore, instead of receiving its input from an external power supply $V_{cc}$ as shown in FIG. 8, the sensing circuit 130 is coupled to the voltage reference circuit 70 in FIG. 5 and the gate of the leaker device 116 of the Y-gating 108 is coupled to the voltage reference circuit of the present invention. The voltage reference output $V_{out}$ 100 of the voltage reference circuit 70 in FIG. 5 ensures that the response of the feedback formed by the W-channel device 134 and the N-channel device 138 does not vary much over supply, temperature and process corners. As such, the overshoot problem encountered at node 132 can be eliminated. At the same time, the voltage reference output $V_{out2}$ coupled to the column select line 118 of the Y-gating 108 ensures that the deselected columns of the cell matrix 106 sufficiently discharges through leaker devices 116. Concurrently, the voltage of output reference coupled to the gate of the leaker devices 116 ensures that the leaker devices do not draw any current on a deselected column. It follows from the above that the frequency response formed by the tracking devices 134 and 138 improves the access time as well as minimize the yield loss of non-volatile memory devices.

While the present invention has been particularly described with reference from FIGS. 1 to 9 with emphasis on integrated circuits, it should be understood that the figures are for illustration only and should not be taken as a limitation on the invention. In addition, it is clear that the method and apparatus of the present invention has utility in many applications where providing constant voltage reference and improving the frequency response during the read mode when non-volatile memory devices are required. It is contemplated that many changes and modifications may be made by one of ordinary skill in the art without departing from the spirit and the scope of the invention as described.

What is claimed is:

1. A voltage reference circuit for generating a reference voltage, comprising:
    (A) a current mirror coupled between a power supply and a return of the power supply for providing the reference voltage, wherein the current mirror comprises:
        (i) a first P-channel transistor and a first W-channel transistor, wherein the first P-channel transistor has a source coupled to the power supply, a drain coupled to a drain of the first W-channel transistor, and a gate coupled to the drain of the first P-channel transistor, wherein the first W-channel transistor has a source coupled to the return of the power supply;
        (ii) a second P-channel transistor, a second W-channel transistor and a first N-channel transistor, wherein the second P-channel transistor has a source coupled to the power supply, a drain coupled to an output node, and a gate coupled to the gate of the first P-channel transistor, wherein the voltage level adjusting means has a first end coupled to the output node and a second end coupled to a drain of the second W-channel transistor, wherein the second W-channel transistor has a source coupled to the return of the power supply and a gate coupled to the drain of the second W-channel transistor, wherein the gate of the second W-channel transistor is also coupled to a gate of the first W-channel transistor; and
        (iii) a third P-channel transistor and a second N-channel transistor, wherein the third P-channel transistor has a source coupled to the power supply, a drain coupled to the output node, and a gate coupled to the gate of the first P-channel transistor, wherein the second N-channel transistor has a source coupled to the return of the power supply, a drain coupled to the output node, and a gate coupled to the drain of the second W-channel transistor, wherein the output node provides the reference voltage, wherein the voltage level adjusting means adjusts a voltage level of the reference voltage at the output node; and
    (B) a start-up circuit coupled to the power supply and the current mirror, wherein the start-up circuit includes a fourth P-channel transistor, a fourth W-channel transistor and a fifth W-channel transistor, wherein the fourth P-channel transistor has a source coupled to the power supply, a drain coupled to a drain of the fourth W-channel transistor, and a gate coupled to the gate of first W-channel transistor, wherein the fourth W-channel transistor has a source coupled to the return of the power supply, and a gate coupled to the gate of the first W-channel transistor, wherein the fifth W-channel transistor has a drain coupled to the power supply, a source coupled to the output node, and a gate coupled to the drain of the fourth W-channel transistor, wherein the reference voltage is independent of a power supply variation, wherein the reference voltage varies as a function of a temperature variation and a process variation.

2. The voltage reference circuit of claim 1, wherein the voltage level of the reference voltage at the output node can be adjusted by adjusting channel lengths and widths of the third W-channel transistor and the first N-channel transistor.

3. The voltage reference circuit of claim 2, wherein the third W-channel transistor has (1) a drain and a gate coupled to the output node and (2) a source coupled to a drain and a gate of the first N-channel transistor, wherein the first N-channel transistor has a source coupled to the drain of the second W-channel transistor.

4. The voltage reference circuit of claim 1, further comprising:
    (a) a third N-channel transistor having a drain coupled to the power supply and a gate coupled to the drain of the first N-channel transistor;
    (b) a sixth W-channel transistor having a drain and a gate coupled to a source of the third N-channel transistor and a source coupled to a second voltage output node; and
    (c) a seventh W-channel transistor having a drain coupled to the second voltage output, a gate coupled to the gate of the second W-channel transistor, and a source coupled the return of the power supply, wherein the second voltage output node provides an output voltage independent of the power supply variation, the temperature variation, and the process variation.

5. The voltage reference circuit of claim 1, further comprising supply independent enhancement means coupled between the output node and the drain of the second N-channel transistor for further increasing independence of the reference voltage to the power supply variation by a predetermined factor.

6. The voltage reference circuit of claim 5, wherein the supply independent enhancement means includes (1) a fifth P-channel transistor having a source coupled to the output node and a drain and a gate coupled to the drain of the second N-channel transistor, and (2) a sixth P-channel transistor having a source coupled to the output node and a drain coupled to the return of the power supply, and a gate coupled to the gate of the fifth P-channel transistor.

7. Circuitry for a memory device, comprising:
(A) a voltage reference circuit for generating a reference voltage that is independent of a power supply variation and varies as a function of a temperature variation and a process variation, wherein the voltage reference circuit comprises:
  (i) a current mirror coupled between the power supply and a return of the power supply for providing the reference voltage, wherein the current mirror comprises:
    (1) a first P-channel transistor and a first W-channel transistor, wherein the first P-channel transistor has a source coupled to the power supply, a drain coupled to a drain of the first W-channel transistor, and a gate coupled to the drain of the first P-channel transistor, wherein the first W-channel transistor has a source coupled to the return of the power supply;
    (2) a second P-channel transistor, a second W-channel transistor, and voltage level adjusting means having a third W-channel transistor and a first N-channel transistor, wherein the second P-channel transistor has a source coupled to the power supply, a drain coupled to an output node, and a gate coupled to the gate of the first P-channel transistor, wherein the voltage level adjusting means has a first end coupled to the output node and a second end coupled to a drain of the second W-channel transistor, wherein the second W-channel transistor has a source coupled to the return of the power supply and a gate coupled to the drain of the second W-channel transistor, wherein the gate of the second W-channel transistor is also coupled to a gate of the first W-channel transistor; and
    (3) a third P-channel transistor and a second N-channel transistor, wherein the third P-channel transistor has a source coupled to the power supply, a drain coupled to the output node, and a gate coupled to the gate of the first P-channel transistor, wherein the second N-channel transistor has a source coupled to the return of the power supply, a drain coupled to the output node, and a gate coupled to the drain of the second W-channel transistor, wherein the output node provides the reference voltage, wherein the voltage level adjusting means adjusts voltage level of the reference voltage at the output node; and
  (ii) a start-up circuit coupled to the power supply and the current mirror for maintaining the current mirror to output the reference voltage, wherein the start-up circuit includes a fourth P-channel transistor, a fourth W-channel transistor and a fifth W-channel transistor, wherein the fourth P-channel transistor has a source coupled to the power supply, a drain coupled to a drain of the fourth W-channel transistor, and a gate coupled to the gate of first W-channel transistor, wherein the fouth W-channel transistor has a source coupled to the return of the power supply, and a gate coupled to the gate of the first W-channel transistor, wherein the fifth W-channel transistor has a drain coupled to the power supply, a source coupled to the output node, and a gate coupled to the drain of the fourth W-channel transistor; and
(B) circuit for receiving the reference voltage, wherein the circuit includes a sixth W-channel transistor, a third N-channel transistor, a fourth N-channel transistor, and a fifth N-channel transistor, wherein the sixth W-channel transistor has a drain coupled to the power supply, and a gate coupled to the output node for receiving the reference voltage, wherein the third N-channel transistor has a drain coupled to a source of the sixth W-channel transistor, a source coupled to the return of the power supply, wherein the fourth N-channel transistor has a drain and a gate coupled to the power supply, wherein the fifth N-channel transistor has a drain coupled to a source of the fourth N-channel transistor, a source coupled to the memory array, and a gate coupled to the source of the sixth W-channel transistor, wherein the third N-channel transistor has a gate coupled to the source of the fifth N-channel transistor, wherein the circuit operates independent of the power supply variation, the temperature variation, and the process variation.

8. The circuitry for the memory device of claim 7, wherein the circuitry for receiving the reference voltage is a Y-gating and sensing circuit of the memory device.

9. The circuitry for the memory device of claim 7, wherein the voltage level of the reference voltage at the output node can be adjusted by adjusting channel lengths and widths of the third W-channel transistor and the first N-channel transistor.

10. The circuitry for the memory device of claim 7, further comprising supply independent enhancement means coupled between the output nod and the drain of the second N-channel transistor for further increasing independence of the reference voltage to the power supply variation by a predetermined factor.

* * * * *

UNITED STATES PATENT AND TRADEMARK OFFICE
CERTIFICATE OF CORRECTION

PATENT NO. : 5,109,187
DATED : April 28, 1992
INVENTOR(S) : Sandeep K. Guliani

It is certified that error appears in the above-indentified patent and that said Letters Patent is hereby corrected as shown below:

| | |
|---|---|
| Col. 5, Line 47 | Delete "respectively" |
| Col. 7, Line 17 | Delete "column select line 18" |
| | Insert--gate of the leaker devices 116-- |
| Col. 7, Line 57 | After the word "transistor" Insert --,-- |
| Col. 7, Line 57 | Delete "and a first N-channel transistor" |
| | Insert -- and voltage level adjusting means having a third W-channel transistor and a first N-channel transistor-- |

Signed and Sealed this

Fifteenth Day of March, 1994

Attest:

BRUCE LEHMAN

*Attesting Officer*      Commissioner of Patents and Trademarks